US007424694B2

(12) United States Patent
Ikeda

(10) Patent No.: US 7,424,694 B2
(45) Date of Patent: Sep. 9, 2008

(54) INTEGRATED CIRCUIT LAYOUT DEVICE, METHOD THEREOF AND PROGRAM THEREOF

(75) Inventor: Hiroshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 364 days.

(21) Appl. No.: 11/394,122

(22) Filed: Mar. 31, 2006

(65) Prior Publication Data

US 2007/0150847 A1    Jun. 28, 2007

(30) Foreign Application Priority Data

Dec. 26, 2005    (JP)    .............................. 2005-372308

(51) Int. Cl.
*G06F 17/50* (2006.01)
(52) U.S. Cl. .............................. 716/6; 716/2
(58) Field of Classification Search ........................ None
See application file for complete search history.

(56) References Cited

U.S. PATENT DOCUMENTS

| | | | | |
|---|---|---|---|---|
| 6,684,375 | B2 * | 1/2004 | Tsukiyama et al. | ............. 716/6 |
| 7,111,260 | B2 * | 9/2006 | Visweswariah | ................. 716/6 |
| 7,239,997 | B2 * | 7/2007 | Yonezawa | ..................... 703/19 |
| 7,320,118 | B2 * | 1/2008 | Homma et al. | ................. 716/6 |
| 2004/0167756 | A1 | 8/2004 | Yonezawa | |
| 2004/0261044 | A1 | 12/2004 | Yonezawa | |
| 2005/0065765 | A1 | 3/2005 | Visweswariah | |
| 2007/0143722 | A1* | 6/2007 | Venkateswaran et al. | ....... 716/6 |
| 2007/0168903 | A1* | 7/2007 | Kahng et al. | .................. 716/19 |
| 2007/0234256 | A1* | 10/2007 | Chang et al. | ................... 716/6 |

FOREIGN PATENT DOCUMENTS

| | | |
|---|---|---|
| JP | 2004-252831 | 9/2004 |
| JP | 2005-11892 | 1/2005 |
| JP | 2005-92885 | 4/2005 |

OTHER PUBLICATIONS

Gattiker et al., "Timing Yield Estimation from Static Timing Analysis," 2001 IEEE, pp. 437-442.*
Guthaus et al., "Gate Sizing Using Incremental Parameterized Statistical Timing Analysis," 2005 IEEE, pp. 1026-1033.*
Heloue et al., "Statistical Timing Analysis with Two-sided Constraints," 2005 IEEE, pp. 828-835.*
Tsukiyama, "Toward Stochastic Design for Digital Circuits—Statistical Static Timing Analysis," 2004 IEEE, pp. 762-767.*

* cited by examiner

*Primary Examiner*—Leigh Marie Garbowski
(74) *Attorney, Agent, or Firm*—Staas & Halsey LLP

(57) ABSTRACT

A layout device for an integrated circuit executes calculating a timing value with respect to each wiring path by a analysis based on connection information and delay information of wirings, determining a target value serving as an improvement target of the wiring path, detecting an error wiring path exhibiting the timing value larger than the target value, changing the wiring connection so that the error wiring path shows a timing value smaller than the target value, updating these piece of information into connection information and delay information of the wirings after changing the wiring connection, calculating a distribution about each wiring path by the analysis based on the post-updating connection information and the post-updating delay information of the wirings and a fluctuation factor, calculating a yield of the integrated circuit from the distribution, and judging whether or not the yield is within an allowable range of a predetermined value.

17 Claims, 11 Drawing Sheets

FIG. 11
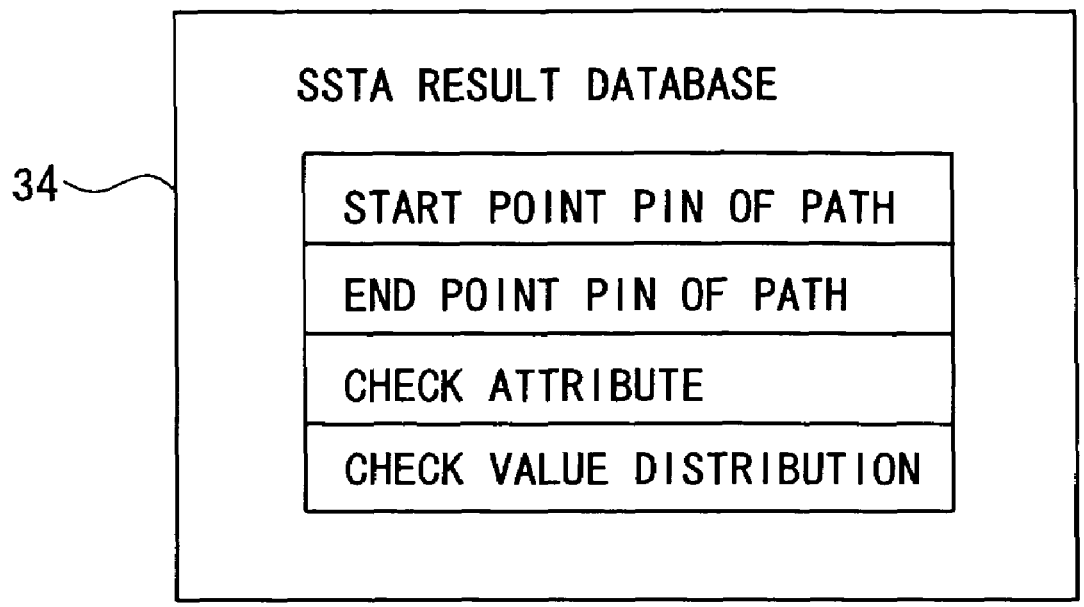
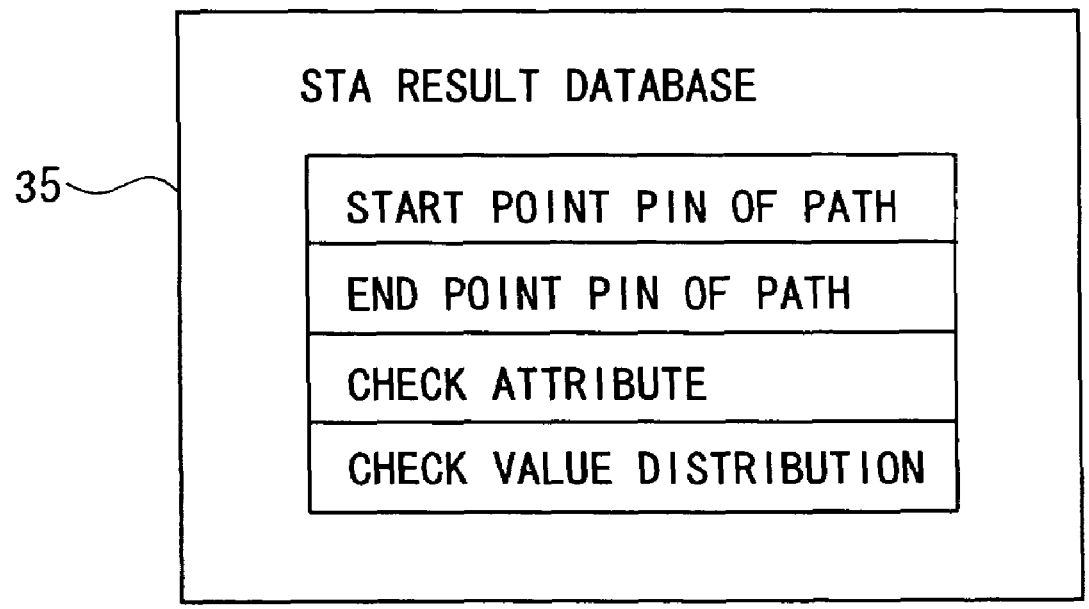

INTEGRATED CIRCUIT LAYOUT DEVICE, METHOD THEREOF AND PROGRAM THEREOF

BACKGROUND OF THE INVENTION

The invention relates to an integrated circuit layout device, a method thereof and a program thereof.

In designing the integrated circuit (e.g., an LSI (Large Scale Integration), an IC (Integrated Circuit), etc) a static timing analysis (Static Timing Analysis) has hitherto been carried out. The static timing analysis (which will hereinafter also be abbreviated to STA) is that a delay of a path is basically computed in total of maximum values or minimum values of delay values of signal propagation time of each of elements building up a logic circuit that connects one sequential circuit to another sequential circuit, and the timing analysis is thus performed. At the present, however, a scatter in the respective element (a manufacturing scatter) becomes relatively large as compared with a delay constraint value of the path. Then, it is difficult to make a design satisfying a timing constraint in the total of the maximum values (or the minimum values) of the respective elements. Hence, there is developed a statistical static timing analysis for obtaining a path delay distribution by plotting delay values of the respective element as a probability distribution and performing a statistical operation from the delay probability distribution of the respective elements on the path.

The statistical static timing analysis (which will hereinafter also be abbreviated to SSTA) enables acquisition of a yield of an integrated circuit that could not be acquired by the STA. Herein, the yield of the integrated circuit connotes a rate of the integrated circuits having an operating frequency exceeding a predetermined frequency. The SSTA has, however, a drawback of requiring a length of processing time and a memory that are several times as much as those of the STA. Hence, turn around time for a timing improvement, which repeatedly changes the design (such as a change in layout and a change in logic) for the timing improvement and evaluation of a yield of the integrated circuit by use of the SSTA, becomes longer than the turn around time for the timing improvement that employs the conventional STA.

[Patent document 1] Japanese Patent Application Laid-Open Publication No.2004-252831

[Patent document 2] Japanese Patent Application Laid-Open Publication No.2005-11892

[Patent document 3] Japanese Patent Application Laid-Open Publication No.2005-92885

SUMMARY OF THE INVENTION

In the technologies described above, the timing error of the path was improved by executing only the SSTA, and the timing error of each path could not be improved in a short period of time. It is an object of the invention to improve the timing error of each path in a shorter period of time than by improving the timing error in a way that performs only the SSTA with respect to each of the paths of the integrated circuit.

The invention adopts the following means in order to solve the problems. (1) Namely, a layout device for an integrated circuit according to the invention (the layout device for the integrated circuit), comprises recording means recording connection information and delay information of wirings, timing value calculating means calculating a timing value with respect to each wiring path by a delay analysis of signal propagation based on the connection information and the delay information of the wirings, target value determining means determining a first target value serving as an improvement target of the wiring path, detecting means detecting an error wiring path exhibiting the timing value larger than the first target value, improving means changing the wiring connection so that the detected error wiring path shows a timing value smaller than the first target value, means updating the connection information and the delay information of the wirings, which are recorded in the recording means, into connection information and delay information of the wirings after changing the wiring connection, distribution calculating means calculating a first distribution about each wiring path by the delay analysis of the signal propagation based on the post-updating connection information and the post-updating delay information of the wirings, and a fluctuation factor, yield calculating means calculating a first yield of the integrated circuit from the first distribution, and judging means judging whether or not the first yield is within an allowable range of a predetermined value. With this configuration, it is possible to improve the timing error of the wiring path exhibiting the timing value larger than the target value for improving the timing error by the STA and the SSTA. Then, it is feasible to recognize whether the yield of the integrated circuit after improving the timing error of the wiring path falls within the allowable range of the predetermined value. Accordingly, the timing error of the wiring path can be improved in the shorter time than by improving the timing error of the wiring path in a way that executes only the SSTA.

(2) The layout device for the integrated circuit may further comprise target value setting means setting a second target value used for determining the first target value, and predicting means predicting a second distribution from the first distribution when each wiring path attains the second target value, wherein the yield calculating means may calculate a second yield of the integrated circuit from the second distribution, and the target value determining means may determine the second target value as the first target value when the second yield is within the allowable range of the predetermined value. With this configuration, it is possible to recognize whether the yield of the integrated circuit after improving the timing error falls within the allowable range of the predetermined value. Accordingly, a necessity of actually conducting the SSTA is eliminated, and the timing error of the wiring path can be improved in the short time.

(3) In the layout device for the integrated circuit, the judging means may judge whether or not the first yield takes, if the second yield is not the allowable range of the predetermined value, a value smaller than the predetermined value, the target value setting means may set, when the second yield takes the value smaller than the predetermined value, a value smaller than the second target value newly as the second target value, and may set, when the second yield does not take the value smaller than the predetermined value, a value larger than the second target value newly as the second target value, and the layout device may further comprise control means controlling the yield calculating means, the judging means, the target value determining means, the target value setting means and the predicting means to perform repetitive executions till the second yield falls within the allowable range of the predetermined value. With this configuration, the target value serving as a target for improving the timing error can be surely determined.

(4) In the layout device for the integrated circuit, the timing value calculating means may calculate a timing value about each wiring path by the delay analysis of the signal propagation based on the connection information and the delay information of the wirings after changing the connections of the wirings; and the layout device further comprises a means determining a specified wiring path based on the timing value, the timing value calculated a timing value about each wiring path by the delay analysis of the signal propagation based on the connection information and the delay information of the wirings after changing the connections of the wirings by said timing value calculating means, wherein said distribution calculating means calculates the first distribution about the specified wiring path by the delay analysis of the signal propagation based on the post-updating connection information, the post-updating delay information and the fluctuation factor. This configuration makes it possible to specify the wiring path exhibiting the large timing error that affects the yield of the integrated circuit. It is therefore possible to reduce the processing time of the SSTA by conducting the SSTA about only the specified wiring path.

(5) In the layout device for the integrated circuit, the predicting means may predict the second distribution from the first distribution by use of a value obtained by subtracting the second target value from the timing value. With this configuration, the second distribution value is predicted from the first distribution value by use of the value obtained by subtracting the assumed target value from the timing value. Accordingly, the prediction can be done at a higher accuracy than by predicting the second distribution value from the first distribution value, simply using the coefficient, and calculating the yield of the integrated circuit.

Further, the invention may be a method by which a computer and other devices, machines, etc execute any one of the processes given above. Still further, the invention may also be a program for making the computer and other devices, machines, etc actualize any one of the functions described above.

According to the invention, it is possible to improve the timing error of each path in a shorter period of time than by improving the timing error in a way that performs only the SSTA with respect to each of the paths of the integrated circuit.

BRIEF DESCRIPTION OF THE DRAWINGS

FIG. 11 is a diagram showing an example of data recorded on an SSTA result database and an STA result database.

DETAILED DESCRIPTION OF THE INVENTION

A best mode (which will hereinafter be termed an embodiment) for carrying out the invention will hereinafter be described with reference to the drawings. A configuration in the following embodiment is an exemplification, and the invention is not limited to the configuration in the embodiment.

An STA (Statistic Timing Analysis) is a timing analysis for checking whether or not inconvenience occurs due to a difference in time when a signal is carried. The timing analysis is exemplified, in a flip-flop and a latch, such as a setup time check for checking whether a data capturing timing is too late or not and a hold time check for checking whether the data capturing timing is too early or not. A value computed as a result of performing the STA and representing a timing error, is referred to as a timing check value (which is also simply termed a check value). In the embodiment, the check value is computed as a result of conducting the timing analysis by the setup time check.

Figure 1:
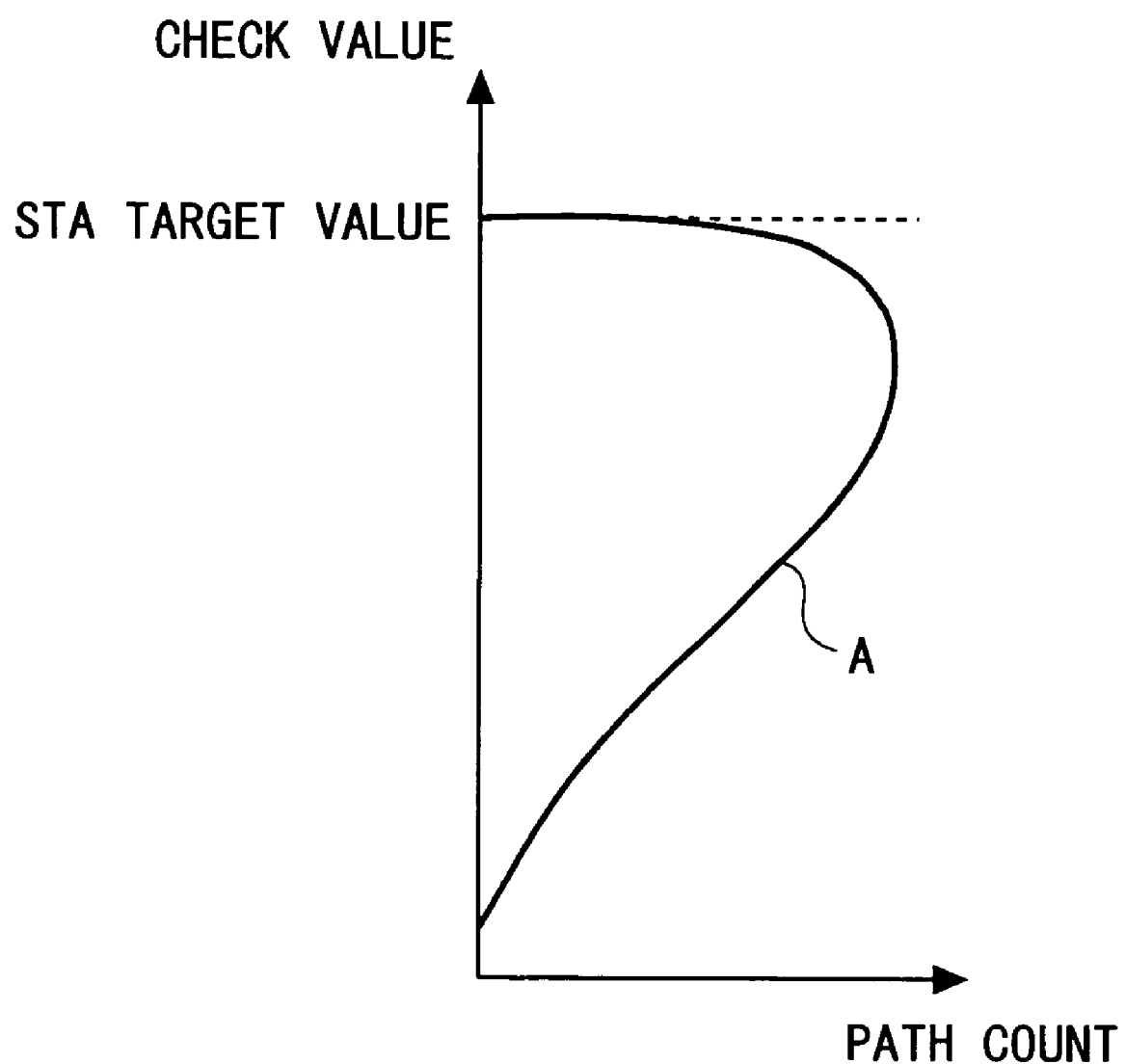
FIG. 1 is a graph showing an example of a distribution of path count representing a check value under a target value.

FIG. 1 is a graph showing an example of a distribution of path count with respect to the check value. FIG. 1 shows the numerical quantity distribution of the paths having the same check value by the standard of the check value. A curve A in FIG. 1 represents the distribution of the path count showing a check value under an STA target value. Herein, the path count represents a numerical quantity of the paths provided on an integrated circuit serving as a timing analysis object.

Further, the STA target value is a target value for improving the timing error of all the paths laid out on the integrated circuit in order to converge an integrated circuit yield after improving the circuit within a predetermined tolerance range with respect to a yield target. Accordingly, if the timing value of all the paths laid out on the integrated circuit is set equal to or smaller than the STA target value, it is estimated that the timing error is improved.

Moreover, the yield target connotes a target value of the yield of the integrated circuit, i.e., a target value of a rate of the integrated circuits operating at, e.g., a predetermined frequency. Namely, the rate of the integrated circuits operating at the predetermined frequency is improved by performing the circuit amelioration, thereby enabling the yield of the integrated circuit to be improved.

The path is a unit for checking the timing error between, e.g., one sequential circuit and another sequential circuit. Further, the path connotes a data path serving as a timing check target path extending from the sequential circuit to the other sequential circuit via a logical circuit. Then, a connection between the sequential circuit and the sequential circuit is established by a combinational logical circuit.

The timing analysis involves checking the timing error occurred in the combinational logical circuit when the signal passes through a gate. In the example shown in FIG. 1, the check value of all the paths is lower than the STA target value. An empirically deduced value has hitherto been determined for the STA target value. Then, the STA is conducted about all the paths, the check value is computed, and a circuit design of the integrated circuit is executed so that the check value of all the paths gets lower than the STA target value. In the case of arbitrarily setting the STA target value, however, even when the check value of all the paths is lower than the STA target value, there is a case in which the yield of the integrated circuit does not attain the target yield.

Figure 2:
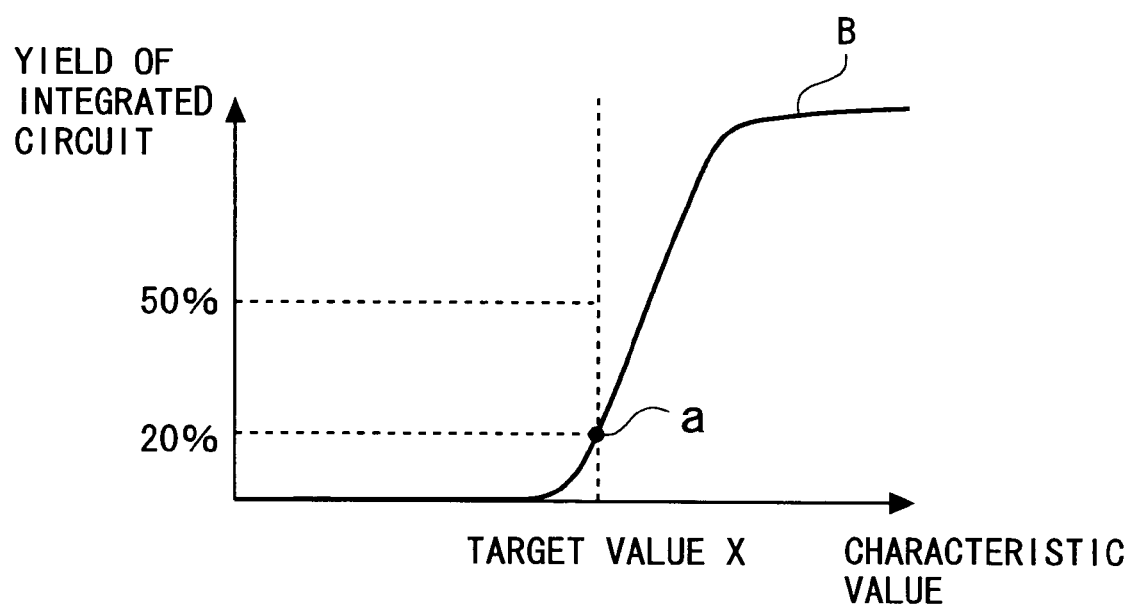
FIG. 2 is a graph showing an example of the distribution in the case of computing a yield of an integrated circuit.

FIG. 2 is a graph showing an example of the distribution in the case of computing the yield of the integrated circuit. A curve B in FIG. 2 represents an example of the yield distribution of the integrated circuit with respect to a characteristic value. In FIG. 2, a target value of the characteristic value is designated at X. Herein, the characteristic value is a value for evaluating the performance of the integrated circuit. A symbol a in FIG. 2, designates a yield value of the integrated circuit that operates with the target value X of the characteristic value. In FIG. 2, the yield of the integrated circuit operating with the target value X is 20%. If the yield target is set at 50%, the yield of the integrated circuit operating with the target value X does not attain the yield target. This implies that the value of all the paths of the integrated circuit is lower than the STA target value, however, the yield of the integrated circuit operating with the target value X does not attain the yield target. In the STA target value in FIG. 1, the yield of the integrated circuit operating with the target value X does not attain the yield target, and hence it is required that a new STA target value be set.

Figure 3:
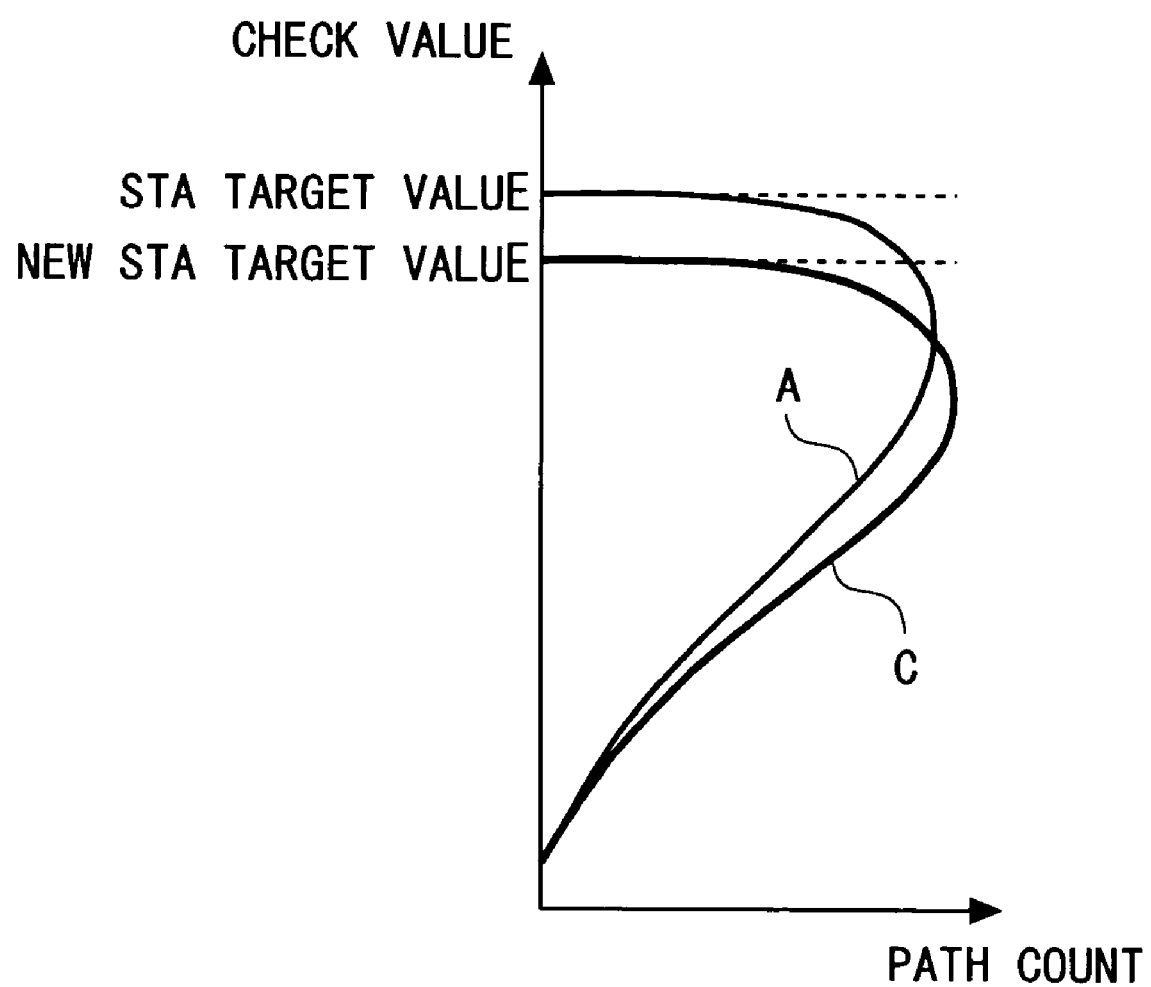
FIG. 3 is a graph showing an example of a distribution of path count with respect to the check value in the case of setting a new STA target value.

Then, till the yield of the integrated circuit attains the yield target, the STA is conducted and timing error is repeatedly improved. FIG. 3 is a graph showing an example of the distribution of the path count with respect to the check value in the case of setting a new STA target value. A curve C in FIG. 3 represents the distribution of the path count that shows the check value lower than the new STA target value. If the yield of the integrated circuit operating with the target value X does not attain the yield target, the new STA target value is set again. Then, the circuit is improved to become lower than the new target value. Next, the check value is computed by performing the STA about each path. In FIG. 3, thus-computed check value is compared with the new STA target value.

Figure 4:
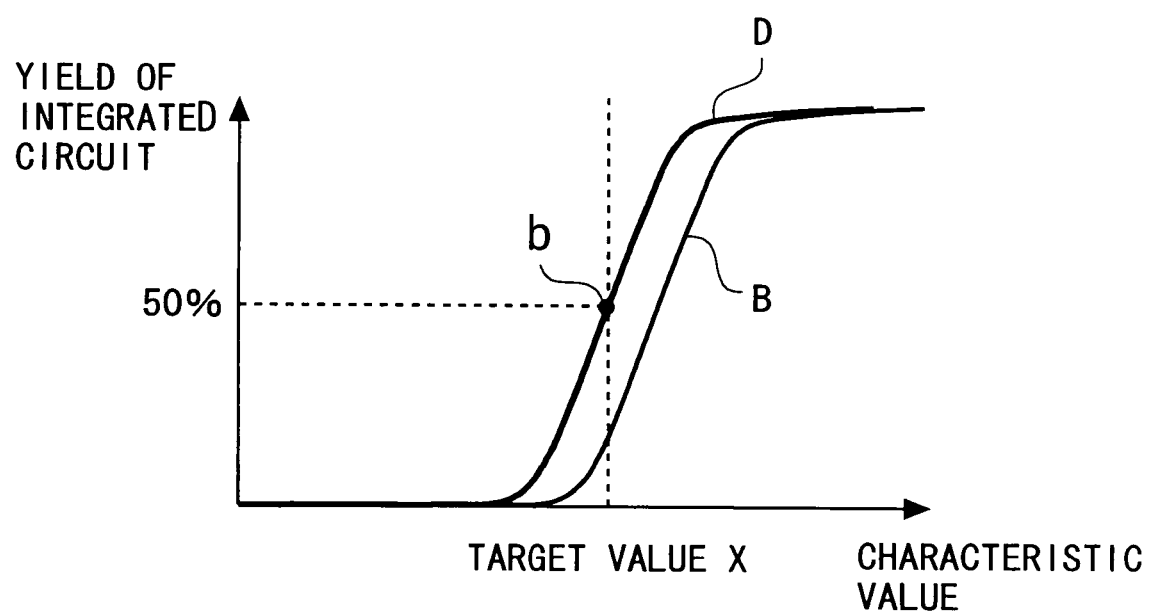
FIG. 4 is a graph showing an example of predicting a yield distribution of the integrated circuit in the case of setting the new STA target value.

FIG. 4 is a graph showing an example of predicting the yield distribution of the integrated circuit in the case of setting the new STA target value. A curve D in FIG. 4 represents an example of the yield distribution of the integrated circuit in the case of predicting that the yield of the integrated circuit will attain the yield target. The curve D extends through b defined as an intersection between a value of 50% defined as the yield target and the target value X, and it is predicted that the yield of the integrated circuit operating with the target value X will attain the yield target.

In the embodiment, there is set such a new STA target value that the yield of the integrated circuit plots the curve D, i.e., such a new STA target value that the yield of the integrated circuit attains the yield target. Performed then are an operation of judging a relationship in magnitude between the check value of every path and the new STA target value and an operation of improving the timing error of the path showing the check value larger than the new STA target value. Further, whether the yield of the integrated circuit will attain the yield target or not is judged by predicting the yield of the integrated circuit in the case of setting the new STA target value. Then, the judgment as to whether or not the yield of the integrated circuit attains the yield target involves performing an SSTA. In the embodiment, the STA is executed with respect to the timing error of the paths of the integrated circuit, and the judgment as to whether or not the yield of the integrated circuit attains the yield target involves performing the SSTA.

Thus, in the embodiment, there decreases an operation count of performing the SSTA becomes smaller than in the case of checking the timing error by conducting only the SSTA about each path. Accordingly, the timing improvement can be carried out in a shorter period than by improving the timing error of the path of the integrated circuit in a way that performs only the SSTA. Moreover, there is shortened a period of turn around time of the trimming improvement, wherein a design change for the timing improvement and the evaluation of the yield of the integrated circuit using the SSTA are repeatedly conducted.

<Whole Configuration>

Figure 5:
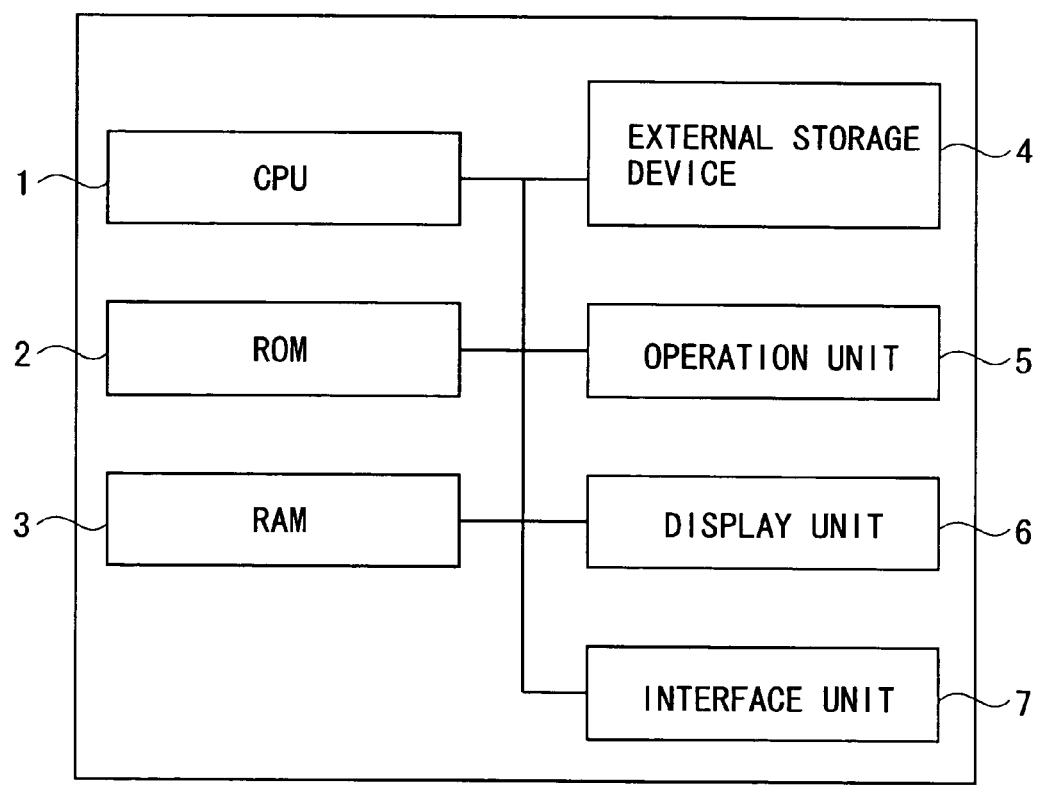
FIG. 5 is a block diagram of a configuration of a CAD system mounted with a layout device for the integrated circuit according to the embodiment.

FIG. 5 is a block diagram showing a configuration of a CAD (Computer-Aided Design) system mounted with a layout device for the integrated circuit according to the embodiment. The CAD system can be actualized by, for instance, installing a computer with a program for making the computer function as the CAD system. As shown in FIG. 5, the CAD system is constructed of a CPU (Central Processing Unit) 1, a ROM (Read Only Memory) 2, a RAM (Random Access Memory) 3, an external storage device 4, an operation unit 5, a display unit 6 and an interface unit 7. These components are connected to each other via a bus.

The CPU 1 executes a variety of processes according to the program stored on the ROM 2. The ROM 2 is stored with OS (Operating System) for actualizing control of inputting and outputting files and control of the CAD system. Further, the ROM 2 is stored with programs and parameters necessary for the CAD system to function. The RAM 3 is stored with data required for the CPU 1 to operate and with application programs executed by the CPU 1. A storage medium (e.g., a hard disc) mounted on the external storage device 4 is stored with the aforementioned programs and necessary data. Moreover, the storage medium mounted on the external storage device 4 is stored with a database (library) used for designing the integrated circuit. The operation unit 5 is exemplified such as a keyboard and a mouse and is operated when inputting predetermined commands and the necessary data. The display unit 6 includes a display device such as a CRT (Cathode Ray Tube), a liquid crystal display and a plasma display, a voice output device such as a speaker and an output device such as a printer device. The interface unit 7 includes a communication device such as a MODEM and a terminal adaptor, and transmits and receives the signals to and from a network like a LAN (Local Area network) etc.

Figure 6:
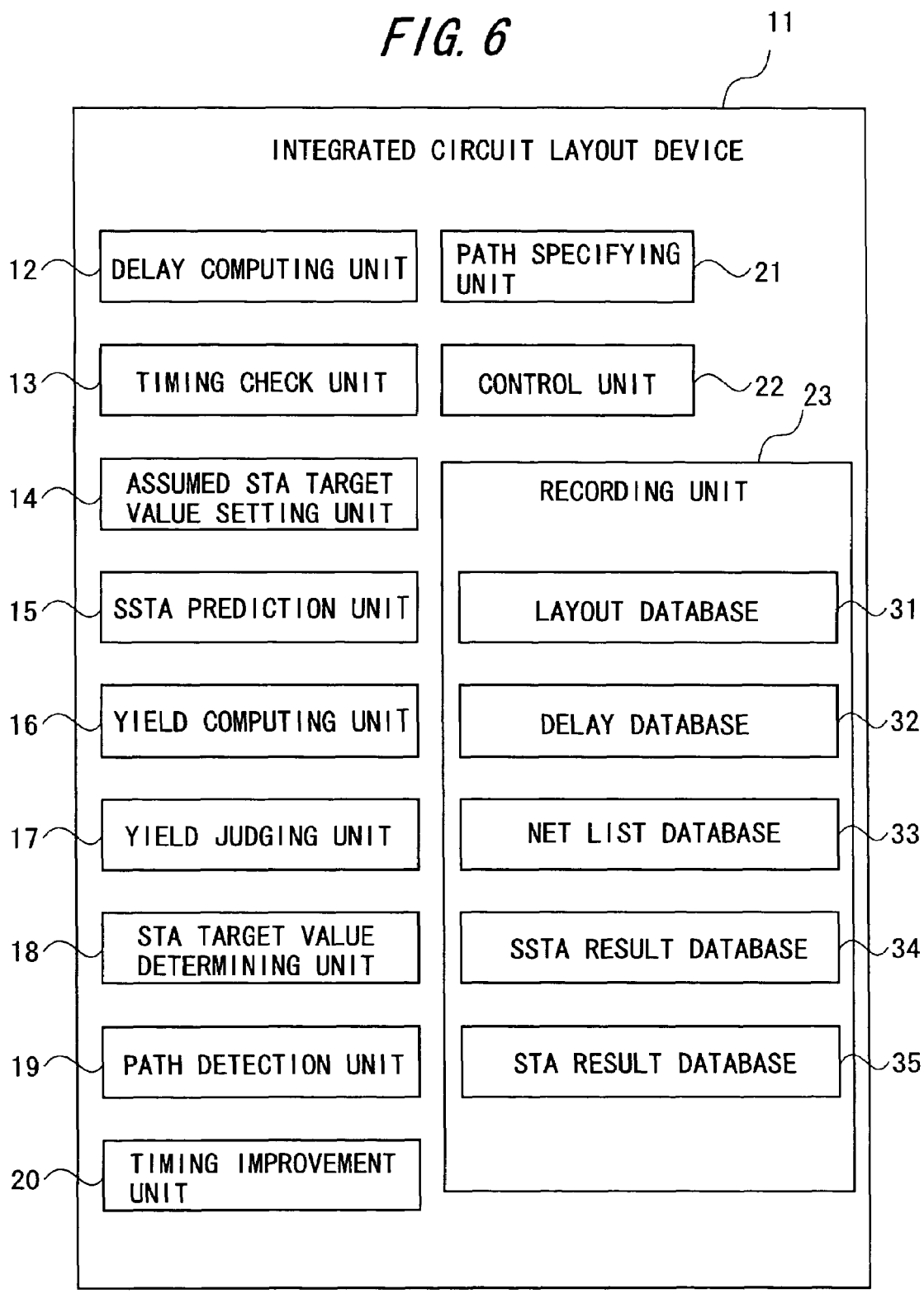
FIG. 6 is a block diagram of a configuration of the integrated circuit layout device according to the embodiment.

FIG. 6 is a block diagram showing a configuration of the integrated circuit layout device according to the embodiment. As shown in FIG. 6, an integrated circuit layout device 11 includes a delay computing unit 12, a timing check unit 13, an assumed STA target value setting unit 14, an SSTA prediction unit 15, a yield computing unit 16, a yield judging unit 17, an STA target value determining unit 18, a path detection unit 19, a timing improvement unit 20, a path specifying unit 21, a control unit 22 and a recording unit 23. Then, the recording unit 23 is constructed of a layout database 31, a delay database 32, a net list database 33, an SSTA result database 34, and an STA result database 35.

The delay computing unit 12 computes delay time of each wiring on the integrated circuit on the basis of layout information and wiring information of the yield improvement target integrated circuit (which will hereinafter be referred to also as a target integrated circuit). The timing check unit 13 verifies as to whether a clock in the integrated circuit and a signal timing are proper or not by use of the delay time computed by the delay computing unit 12. To be specific, the STA is conducted about all the paths of the target integrated circuit by employing the net list of the integrated circuit and the delay information, thereby computing the timing check value. Further, the SSTA is executed about all the paths of the target integrated circuit by use of the net list of the integrated circuit and the delay information. Moreover, in the SSTA, the timing check is done in consideration of fluctuation factors. Then, as a result of performing the SSTA, a timing check value distribution (which will hereinafter simply be termed a check value distribution) is computed. The check value distribution is organized as a path delay distribution, wherein the delay values of the respective elements are plotted as a probability distribution, a statistic operation is performed based on the delay probability distribution of the respective elements on the paths, and the path delay distribution is thus acquired.

In the SSTA, the delay time is evaluated as the distribution in consideration of the fluctuation factors that affect the paths. A manufacturing scatter due to fluctuations in dimensional accuracy of each element is given as the fluctuation factor. The manufacturing scatter, in which there occur fluctuations in dimensional accuracy of dimensions such as a gate length, a wiring length and a wiring width, causes fluctuations in propagation time of the signal passing through the gate. Further, the manufacturing scatter causes fluctuations in electric characteristics of a transistor. An amplification value of the transistor fluctuates, with the result that a driving ability of the transistor fluctuates, which leads to occurrence of fluctuations in the signal propagation time. Moreover, a change in resistance value due to fluctuations in poly-silicon composing a resistance and in impurity concentration of a diffused layer, causes the fluctuations in the signal propagation time. Moreover, there is a manufacturing scatter due to fluctuations in parasitic capacity. The timing check by the SSTA will hereinafter be assumed to compute the check value distribution in a way that takes account of the fluctuation factors.

The assumed STA target value setting unit 14 sets an assumed (tentative) STA target value used for determining the STA target value. The SSTA prediction unit 15 predicts and computes the check value distribution after the timing improvement from the path timing check value distribution.

The yield computing unit 16 computes the yield of the integrated circuit from the path timing check value distribution with the SSTA conducted with respect to the target integrated circuit. The yield judging unit 17 judges whether or not the yield of the integrated circuit falls within a predetermined tolerance range with respect to the yield target. Further, the yield judging unit 17 judges whether or not the integrated circuit yield computed from the post-prediction check value distribution is smaller than the yield target. The post-prediction check value distribution connotes a check value distribution after the check value of each path of the target integrated circuit has been improved up to the STA target value.

The STA target value determining unit 18 determines one STA target value about the target integrated circuit. The path detection unit 19 detects a path exhibiting a larger check value of the path with the STA conducted than the STA target value. The timing improvement unit 20 executes the timing improvement for the path of which the check value is judged larger than the STA target value.

The path specifying unit 21 specifies beforehand a path having a large delay that affects the yield of the integrated circuit. The control unit 22 controls the assumed STA target value setting unit 14, the yield computing unit 16, the yield judging unit 17 and the STA target value determining unit 18 to repeatedly execute the processes till the yield of the integrated circuit reaches the yield target tolerance range.

The layout database 31 is recorded with the layout information and the wiring information of the target integrated circuit. The delay database 32 is recorded with delay information obtained as a result of computing the delay. The net list database 33 is recorded with the net list of the target integrated circuit. Herein, the net list is defined as circuit information on the configuration of the circuit elements of the integrated circuit and on the wirings between the circuit elements.

The SSTA result database 34 is recorded with results of the respective paths with the SSTA conducted. Further, the STA result database 35 is recorded with results of the respective paths with the STA conducted. As shown in FIG. 11, the SSTA result database 34 is recorded with a start point pin and an end point pin of the path where the SSTA is conducted, a check attribute showing a type of the timing check, and a check value distribution of the path where the SSTA is performed. The STA result database 35 is recorded with a start point pin and an end point pin of the path where the STA is conducted, a check attribute showing a type of the timing check, and a check value. Further, when the information recorded on the recording unit 23 is updated, each piece of post-updating information is recorded.

FIRST EMBODIMENT

<Process of Converging Integrated Circuit Yield within Yield Target Allowable Range>

Figure 7:
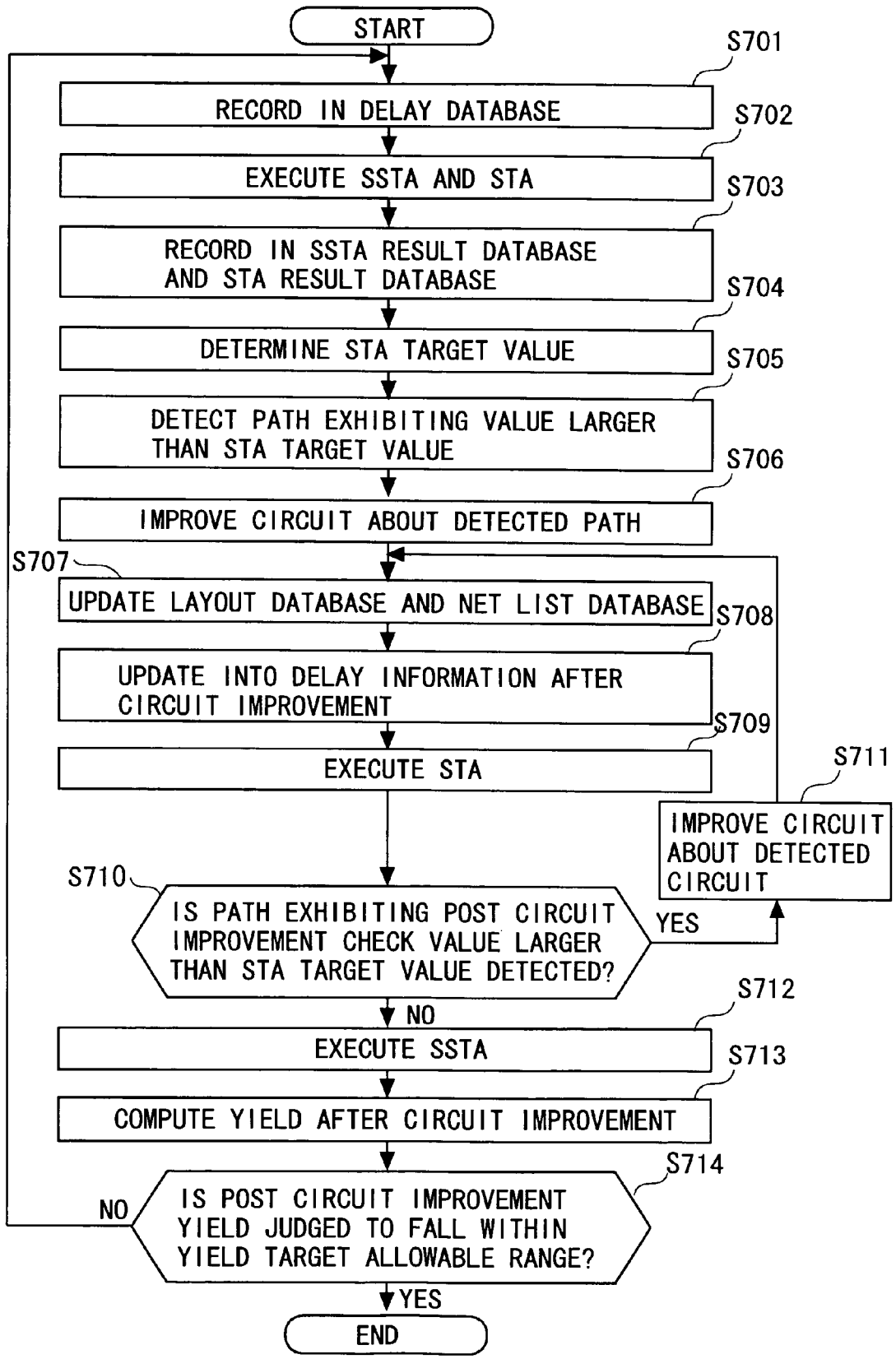
FIG. 7 is a flowchart showing a process of converging the yield of the integrated circuit within a yield target allowable range.

FIG. 7 is a flowchart of a process of converging the yield of the integrated circuit within a yield target allowable range. To start with, the delay computing unit 12 computes the delay time of each path on the basis of the layout information and the wiring information of the target integrated circuit. The layout information and the wiring information of the target integrated circuit are previously recorded on the layout database 31. Then, the delay computing unit 12 records the delay database 32 with the delay information defined as a result of performing the delay computation (S701).

Next, based on the net list and the delay information, the timing check unit 13 executes the timing check by the SSTA and the STA with respect to each of the paths of the target integrated circuit (S702). Herein, the timing check may involve doing simulation and may also involve making the actual measurement. Further, the timing check unit 13 records a result of performing the timing check by the SSTA in the SSTA result database 34, and records a result of performing the timing check by the STA in the STA result database 35 (S703).

Then, the STA target value determining unit 18 determines the STA target value by use of the check value distribution and the check value (S704). A process of determining the STA target value is that at first, the assumed STA target value is set in an initial value of the STA target value, and an optimum value is determined as the STA target value from the assumed STA target value. This STA target value determining process will be described in depth later on. Moreover, the path detection unit 19 detects a path of which a check value computed in the process in S702 is larger than the STA target value (S705). Then, the timing improvement unit 20 executes a process for the circuit improvement with respect to the path detected in the process in FIG. 705 (S706). Herein, the circuit improvement is actualized by making a layout change and a logic change of the paths of the integrated circuit.

Next, the timing improvement unit 20 updates the layout information and the wiring information of the target integrated circuit in the layout database 31 into those of the target integrated circuit after the circuit improvement Further, the timing improvement unit 20 updates the net list recorded in the net list database 33 into the net list after the circuit improvement (S707). Moreover, the delay computing unit 12 recomputes, based on the layout information and the wiring information of the target integrated circuit after the circuit improvement, the delay time of each wiring, and works out the delay information. Then, the delay computing unit 12 updates the delay information recorded in the delay database 32 into the delay information computed after the circuit improvement (S708).

Next, the timing check unit 13 performs, based on the post-updating net list and the post-updating delay information, the timing check by the STA with respect to each path subjected to the execution of the circuit improvement (S709). Then, the path detection unit 19 detects the path of which the check value is larger than the STA target value (S710). If there is a path of which the post circuit improvement check value is larger than the STA target value, the timing improvement unit 20 again executes the circuit improvement for this path (S711). The circuit improvement involves repeating the processes in S707 through S710 till the path of which the post circuit improvement check value is larger than the STA target value disappears. Whereas if there is none of the path of which the post circuit improvement check value is larger than the STA target value, the timing check unit 13 conducts the timing check by the SSTA about all the paths of the target integrated circuit on the basis of the net list after the circuit improvement and the delay information after the circuit improvement. Then, the timing check unit 13 computes the check value distributions with respect to all the paths (S712).

Next, the yield computing unit 16 computes the yield of the integrated circuit after the circuit improvement by use of the check value distributions computed in the process in S712 about all the paths of the target integrated circuit (S713). Then, the yield judging unit 17 judges whether or not the yield of the integrated circuit after the circuit improvement is within the yield target allowable range (S714). If the yield of the integrated circuit after the circuit improvement is not within the yield target allowable range, the processes in S701 through S714 are repeatedly executed till the yield of the integrated circuit after the circuit improvement falls within the yield target allowable range. While on the other hand, if the yield of the integrated circuit after the circuit improvement is within the yield target allowable range, the process of converging the yield of the integrated circuit within the yield target allowable range, is terminated.

Thus, the processes for the circuit improvement and for the timing check are repeatedly executed till the yield of the integrated circuit after the circuit improvement converges within the yield target allowable range. Further, the yield target allowable range can be arbitrarily set. For example, when the yield target is 50%, the allowable range can be set to a ±1% range from 50%. According to the embodiment, the timing error of each path can be improved in a shorter period of time than by improving the timing error in a way that executes only the SSTA about each of the paths of the target integrated circuit. Then, the turn around time of the circuit improvement can be reduced owing to the improvement of the timing error in the short time.

<Path Specifying Process>

Next, a path specifying process will be explained. The path specifying process connects a process of specifying the path in which to execute the SSTA in the process of converging the yield of the integrated circuit within the yield target allowable range. The path specifying process involves executing the processes shown in S701 through s710 in FIG. 7.

Then, in the process in S710, if there is none of the path of which the check value after conducting the circuit improvement is larger than the STA target value, the path specifying unit 21 specifies, based on the post circuit improvement net list and the post circuit improvement delay information, the path in which to conduct the SSTA in the respective paths of the target integrated circuit. When specifying the path, a path exhibiting a large delay having a possibility of affecting the yield of the integrated circuit, is specified. The path exhibiting the large delay having the possibility of affecting the yield of the integrated circuit, is determined from a result of performing the STA in the processes in S702 and S709.

Next, the processes in S712 through S714 are executed by limiting the specified path. Thus, owing to the execution of the path specifying process, only the specified path can be set as the SSTA target, and the SSTA processing time can be reduced. Then, the reduction in the SSTA processing time enables a further reduction of the turn around time of the circuit improvement.

<STA Target Value Determining Process>

Figure 8:
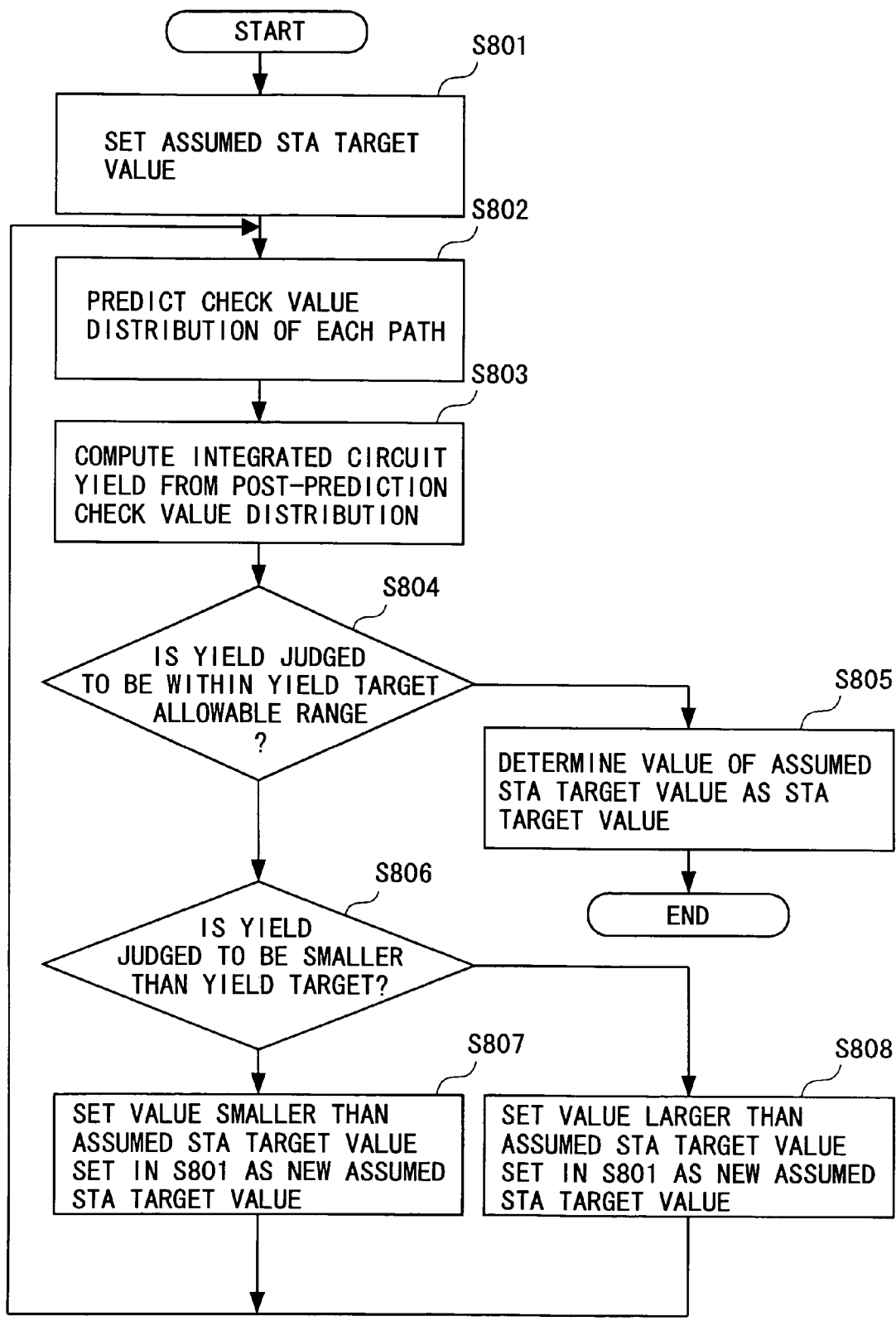
FIG. 8 is a flowchart showing an STA target value determining process.

FIG. 8 is a flowchart of an STA target value determining process. Convergence of the yield of the integrated circuit after executing the timing improvement within the yield target allowable range, requires determining a optimal value to the STA target value. In the case of setting an arbitrary value as the initial value of the STA target value, a possibility that the arbitrary value becomes the optimal value to the STA target value, is low. Such being the case, there is executed a process of, to begin with, setting the assumed STA target value into the initial value of the STA target value, and determining the optimal value to the STA target value from the assumed STA target value.

At first, the assumed STA target value setting unit 14 sets an arbitrary value as the assumed STA target value (S801). Next, the SSTA predicting unit 15 predicts the check value distribution of each path in the case where the check value of each of the paths of the target integrated circuit is improved up to the assumed STA target value (S802) Then, the yield computing unit 16 computes the yield of the integrated circuit from the post-prediction check value distribution (S803). Next, the yield judging unit 17 judges whether or not the integrated circuit yield computed in the process in S803 is within the yield target allowable range (S804). The STA target value determining unit 18, if the integrated circuit yield computed in the process in S803 is within the yield target allowable range, determines a value of the assumed STA target value as the STA target value (S805). Then, when the STA target value is determined, the STA target determining process is terminated.

While on the other hand, the yield judging unit 17, if the integrated circuit yield computed in the process in S803 is not within the yield target allowable range, judges whether or not the integrated circuit yield computed in the process in S803 is smaller than yield target (S806). If the integrated circuit yield computed in the process in S803 is smaller than yield target, the assumed STA target value setting unit 14 sets, as a new assumed STA target value, a value smaller than the assumed STA target value set in S801 (S807). Whereas if the integrated circuit yield computed in the process in S803 is larger than yield target, the assumed STA target value setting unit 14 sets, as a new assumed STA target value, a value larger than the assumed STA target value set in S801 (S808).

Next, after setting the new assumed STA target value, the circuit improving process is executed. Thereafter, the SSTA prediction unit 15, getting back to the process in S802, predicts the check value distribution of each path after being improved up to the new assumed STA target value set in the process in S807 or S808. If the new assumed STA target value is set to a value smaller than the just-anterior set assumed STA target value, the integrated circuit yield computed from the post-prediction check value distribution, takes a small value. Further, if the new assumed STA target value is set to a value larger than the just-anterior set assumed STA target value, the integrated circuit yield computed from the post-prediction check value distribution, takes a larger value. The STA target value taking the optimal value for converging the yield of the integrated circuit after conducting the timing improvement within the yield target allowable range, is determined by utilizing this property. For instance, with utilization of a bisection algorithm, the assumed STA target value is set several times, and it is possible to determine such an STA target value that the yield of the integrated circuit after the execution of the timing improvement and the yield target fall within a difference range with no problem in terms of accuracy. Thus, the processes in S802 through S808 are repeated till the STA target value is determined.

Moreover, in the embodiment, the check value is computed as the result of effectuating the timing analysis by the setup time check. In the case of computing the check value as the result of executing the timing analysis by the hold time check, however, the value for setting the new assumed STA target value becomes a value reversed to the value given above.

<Check Value Distribution Predicting Process>

Explained next is a process of predicting the check value distribution of each path in the case where the check value of each of the paths of the respective integrated circuits is improved up to the assumed STA target value in the STA target value determining process.

Figure 9:
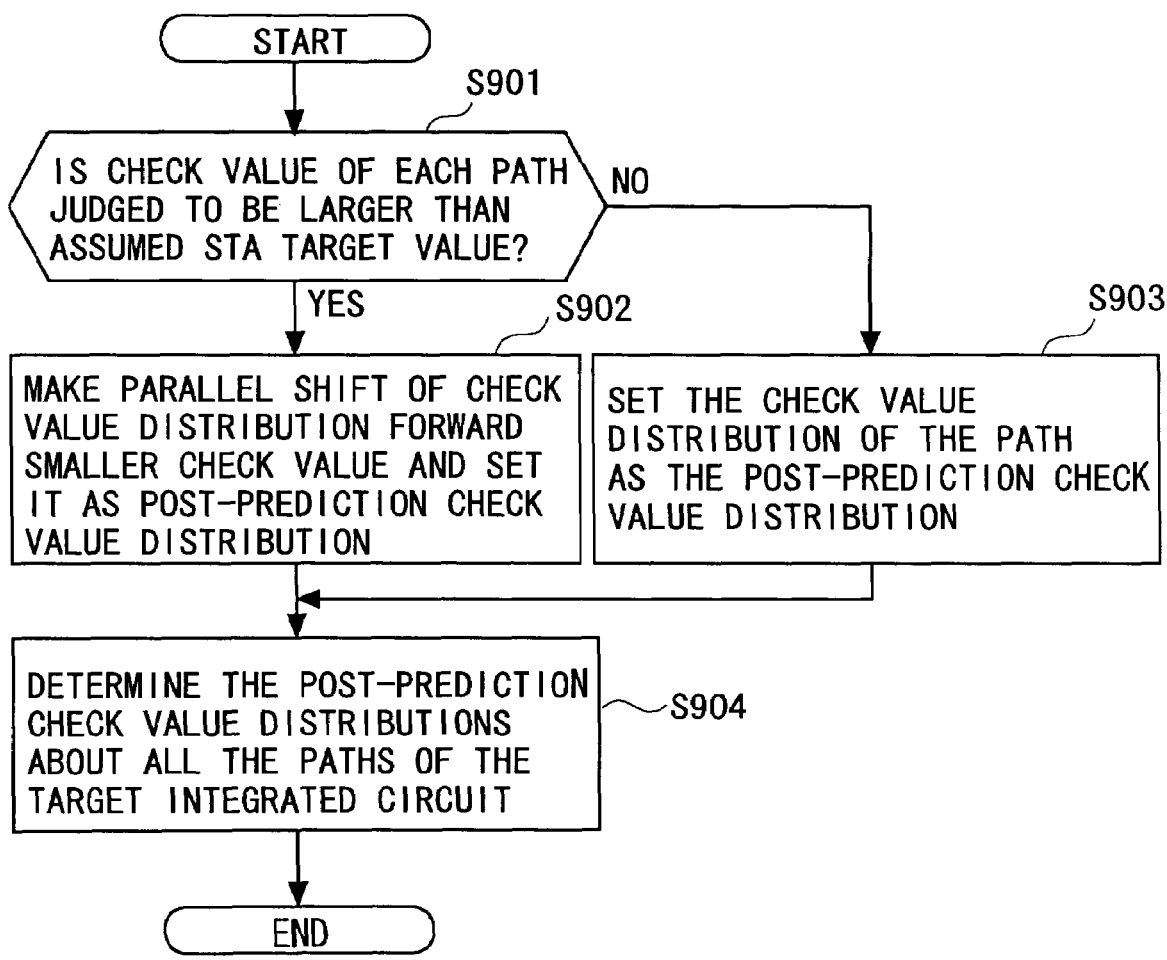
FIG. 9 is a flowchart showing a check value distribution predicting process.

FIG. 9 is a flowchart showing the check value distribution predicting process. At first, the SSTA prediction unit 15 judges whether or not the check value is larger than the assumed STA target value with respect to all the paths of the target integrated circuit (S901). If the check value of the path is larger than the assumed STA target value, the SSTA prediction unit 15 parallel-shifts the check value distribution of this path toward the smaller check value. Then, the SSTA prediction unit 15 sets the parallel-shifted check value distribution as a post-prediction check value distribution (S902). A value for parallel-shifting the check value distribution toward the smaller check value can take an arbitrary value. For example, the check value distribution can be parallel-shifted toward the smaller check value by a value obtained in a way that subtracts the assumed STA target value from the check value of each of the paths of the target integrated circuit.

Figure 10:
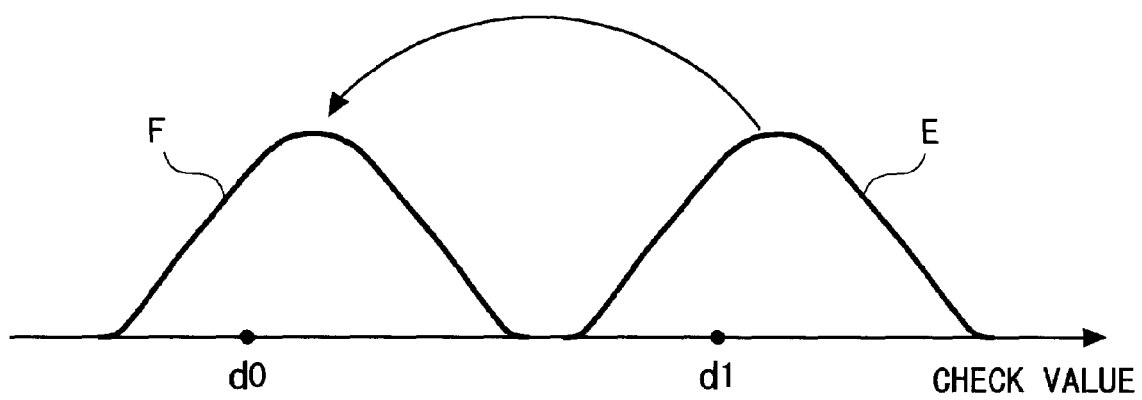
FIG. 10 is a graph in the case of parallel-shifting the check value distribution in a smaller check value direction by a value obtained by subtracting an assumed STA target value from the check value of the path of the integrated circuit.

FIG. 10 is a graph in the case of parallel-shifting the check value distribution (a curve E in FOG. 10) toward the smaller check value by the value obtained in a way that subtracts the assumed STA target value (d0 in FIG. 10) from the check value (d1 in FIG. 10) of the path of the target integrated circuit. The axis of abscissa indicates the check value of the path. In FIG. 10, the right direction is set as a larger check value direction, while the left direction is set as a smaller check value direction. The curve E in FIG. 10 represents the check value distribution of the path. Further, a curve F in FIG. 10 is a curve depicted when parallel-shifting the curve E, and represents the post-prediction check value distribution in the case where the check value of the path is improved up to the assumed STA target value. In FIG. 10, d1 designates a check value of the path. Moreover, d0 represents the STA target value of the path. Then, the check value distribution represented by the curve E is parallel-shifted in the smaller check value direction (in the left direction) by a value given by d1-d0.

Whereas if the check value of the path is smaller than the assumed STA target value, the SSTA prediction unit 15 sets the check value distribution of this path as the post-prediction check value distribution (S903). Then, the SSTA prediction unit 15 determines the post-prediction check value distributions about all the paths of the target integrated circuit (S904). In the case of determining the post-prediction check value distributions about all the paths of the target integrated circuit, the check value distribution predicting process is terminated.

In FIG. 10, the check value distribution represented by the curve E is parallel-shifted in the smaller check value direction (in the left direction) by the value given such as d1-d0. The embodiment is not limited to this shift value, and, for instance, the check value distribution may be parallel-shifted using a value obtained by multiplying the (d1-d0) value by 0.7.Further, in the embodiment, the check value is computed as the result of performing the timing analysis based on the setup time check. In the case of computing the check value as the result of conducting the timing analysis based on the hold time check, however, the check value distribution is parallel-shifted in the reversed direction (the right direction).

<Process Computing Integrated Circuit Yield from Check Value Distribution>

Given next is an explanation of a process of computing the yield of the integrated circuit from the check value distribution of each of the paths of the target integrated circuit. To start with, the timing check unit 13 executes the SSTA about all the paths of the target integrated circuit, thereby computing the check value distributions. Then, the yield computing unit 16 converts the check value distributions of all the paths of the target integrated circuit into cumulative distribution functions. Next, the yield computing unit 16 obtains a value by cumulatively multiplying the cumulative distribution functions of all the paths of the target integrated circuit, and set this value as the yield of the integrated circuit.

SECOND EMBODIMENT

The first embodiment is that in the check value distribution predicting process, the check value distribution is parallel-shifted in the smaller check value direction by the value obtained by subtracting the assumed STA target value from the check value of each of the paths of the target integrated circuit. A second embodiment is that the parallel-shifting value is adjusted by a coefficient in a way that uses an empirically experimentally acquired coefficient. In this case, the coefficient can be changed on a path-by-path basis from a circuit topology such as path branching and path confluence. Further, in the check value distribution predicting process, the post-prediction check value distribution can be also obtained not by parallel-shifting the check value distribution but by changing a form of the check value distribution. In this case, the post-prediction check value distribution can be also acquired by changing the form of the check value distribution from the circuit topology such as the path branching and the path confluence. In the second embodiment, other configurations and operations are the same as those in the first embodiment.

<Computer Readable Recording Medium>

It is possible to record a program which causes a computer to implement any of the functions described above on a computer readable recording medium. By causing the computer to read in the program from the recording medium and execute it, the function thereof can be provided. The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-mm tape, and a memory card. Of such recording media, those fixed to the computer include a hard disk and a ROM (Read Only Memory).

<Others>

The disclosures of Japanese patent application No.JP2005-372308 filed on Dec. 26, 2005 including the specification, drawings and abstract are incorporated herein by reference.

What is claimed is:

1. A layout device for an integrated circuit, comprising:
   a recording unit recording connection information and delay information of wirings;
   a timing value calculating unit calculating a timing value with respect to each wiring path by a delay analysis of signal propagation based on the connection information and the delay information of the wirings;
   a target value determining unit determining a first target value serving as an improvement target of the wiring path;
   a detecting unit detecting an error wiring path exhibiting the timing value larger than the first target value;
   a improving unit changing the wiring connection so that the detected error wiring path shows a timing value smaller than the first target value;
   a unit updating the connection information and the delay information of the wirings, which are recorded in said recording unit, into connection information and delay information of the wirings after changing the wiring connection;
   a distribution calculating unit calculating a first distribution about each wiring path by the delay analysis of the signal propagation based on the post-updating connection information and the post-updating delay information of the wirings, and a fluctuation factor;
   a yield calculating unit calculating a first yield of said integrated circuit from the first distribution; and
   a judging unit judging whether or not the first yield is within an allowable range of a predetermined value.

2. A layout device for an integrated circuit according to claim 1, further comprising:
   a target value setting unit setting a second target value used for determining the first target value; and
   a predicting unit predicting a second distribution from the first distribution when each wiring path attains the second target value,
   wherein said yield calculating unit calculates a second yield of said integrated circuit from the second distribution, and
   said target value determining unit determines the second target value as the first target value when the second yield is within the allowable range of the predetermined value.

3. A layout device for an integrated circuit according to claim 2, wherein said judging unit judges whether or not the first yield takes, if the second yield is not the allowable range of the predetermined value, a value smaller than the predetermined value;
   said target value setting unit sets, when the second yield takes the value smaller than the predetermined value, a value smaller than the second target value newly as the second target value, and sets, when the second yield does not take the value smaller than the predetermined value, a value larger than the second target value newly as the second target value, and
   said layout device further comprises a control unit controlling said yield calculating unit, said judging unit, said target value determining unit, said target value setting unit and said predicting unit to perform repetitive executions till the second yield falls within the allowable range of the predetermined value.

4. A layout device for an integrated circuit according to claim 3, wherein said timing value calculating unit calculates a timing value about each wiring path by the delay analysis of the signal propagation based on the connection information and the delay information of the wirings after changing the connections of the wirings; and
   said layout device further comprises a unit determining a specified wiring path based on the timing value, the timing value calculated a timing value about each wiring path by the delay analysis of the signal propagation based on the connection information and the delay information of the wirings after changing the connections of the wirings by said timing value calculating unit,
   wherein said distribution calculating unit calculates the first distribution about the specified wiring path by the delay analysis of the signal propagation based on the post-updating connection information, the post-updating delay information and the fluctuation factor.

5. A layout device for an integrated circuit according to claim 4, wherein said predicting unit predicts the second distribution from the first distribution by use of a value obtained by subtracting the second target value from the timing value.

6. A layout device for an integrated circuit, comprising:
   a calculating unit calculating an analysis value about each wiring path by a delay analysis of signal propagation based on connection information of the wirings and delay information of the wirings on an integrated circuit;
   a determining unit determining a first target value serving as a target of the analysis value about the wiring path on said integrated circuit;
   a detecting unit detecting the wiring path showing an analysis value larger than the first target value;
   a changing unit changing the connection of the wiring so that the analysis value about the detected wiring path takes a value smaller than the first target value;
   a distribution calculating unit calculating an analysis value distribution about each wiring path by the delay analysis of the signal propagation based on the post-changing connection information and the post-changing delay information of the wirings, and a fluctuation factor; and
   a yield calculating unit calculating a first yield of said integrated circuit from the analysis value distribution.

7. A layout method for an integrated circuit, comprising:
   a recording step of recording connection information and delay information of wirings;
   a timing value calculating step of calculating a timing value with respect to each wiring path by a delay analysis of signal propagation based on the connection information and the delay information of the wirings;
   a target value determining step of determining a first target value serving as an improvement target of the wiring path;
   a detecting step of detecting an error wiring path exhibiting the timing value larger than the first target value;
   an improving step of changing the wiring connection so that the detected error wiring path shows a timing value smaller than the first target value;
   a step of updating the connection information and the delay information of the wirings, which are recorded by said recording step, into connection information and delay information of the wirings after changing the wiring connection;
   a distribution calculating step of calculating a first distribution about each wiring path by the delay analysis of the signal propagation based on the post-updating connection information and the post-updating delay information of the wirings, and a fluctuation factor;

a yield calculating step of calculating a first yield of said integrated circuit from the first distribution; and a judging step of judging whether or not the first yield is within an allowable range of a predetermined value.

8. A layout method for an integrated circuit according to claim 7, further comprising:

a target value setting step of setting a second target value used for determining the first target value; and a predicting step of predicting a second distribution from the first distribution when each wiring path attains the second target value, wherein said yield calculating step includes calculating a second yield of said integrated circuit from the second distribution, and said target value determining step includes determining the second target value as the first target value when the second yield is within the allowable range of the predetermined value.

9. A layout method for an integrated circuit according to claim 8, wherein said judging step includes judging whether or not the first yield takes, if the second yield is not the allowable range of the predetermined value, a value smaller than the predetermined value;

said target value setting step includes setting, when the second yield takes the value smaller than the predetermined value, a value smaller than the second target value newly as the second target value, and setting, when the second yield does not take the value smaller than the predetermined value, a value larger than the second target value newly as the second target value, and said layout method further comprises a control step of controlling so as to repeatedly execute said yield calculating step, said judging step, said target value determining step, said target value setting step and said predicting step till the second yield falls within the allowable range of the predetermined value.

10. A layout method for an integrated circuit according to claim 9, wherein said timing value calculating step calculates a timing value about each wiring path by the delay analysis of the signal propagation based on the connection information and the delay information of the wirings after changing the connections of the wirings; and said layout method further comprises a step of determining a specified wiring path based on the timing value, the timing value calculated a timing value about each wiring path by the delay analysis of the signal propagation based on the connection information and the delay information of the wirings after changing the connections of the wirings by said timing value calculating step, wherein said distribution calculating step includes calculating the first distribution about the specified wiring path by the delay analysis of the signal propagation based on the post-updating connection information, the post-updating delay information and the fluctuation factor.

11. A layout method for an integrated circuit according to claim 10, wherein said predicting step includes predicting the second distribution from the first distribution by use of a value obtained by subtracting the second target value-from the timing value.

12. A layout method for an integrated circuit, comprising:

a calculating step of calculating an analysis value about each wiring path by a delay analysis of signal propagation based on connection information of the wirings and delay information of the wirings;

a step of judging a relationship in magnitude with respect to each wiring path between the analysis value and a first target value serving as an improvement target of the wiring path;

a step of predicting a yield of said integrated circuit on the basis of the judged relationship in magnitude with the analysis value;

a step of setting, if the predicted yield does not attain a yield target, a second target value different from the first target value;

a step of changing a layout of the wiring path so that the analysis value about each wiring path becomes smaller than the second target value; and a step of predicting the yield of said integrated circuit in accordance with the layout-changed wiring path.

13. A computer readable storage medium storing a layout program for an integrated circuit which, when executed by a computer causes the computer to perform the following steps comprising:

a recording step of recording connection information and delay information of wirings;

a timing value calculating step of calculating a timing value with respect to each wiring path by a delay analysis of signal propagation based on the connection information and the delay information of the wirings;

a target value determining step of determining a first target value serving as an improvement target of the wiring path;

a detecting step of detecting an error wiring path exhibiting the timing value larger than the first target value;

an improving step of changing the wiring connection so that the detected error wiring path shows a timing value smaller than the first target value;

a step of updating the connection information and the delay information of the wirings, which are recorded by said recording step, into connection information and delay information of the wirings after changing the wiring connection;

a distribution calculating step of calculating a first distribution about each wiring path by the delay analysis of the signal propagation based on the post-updating connection information and the post-updating delay information of the wirings, and a fluctuation factor;

a yield calculating step of calculating a first yield of said integrated circuit from the first distribution; and a judging step of judging whether or not the first yield is within an allowable range of a predetermined value.

14. A computer readable storage medium storing a layout program for an integrated circuit according to claim 13, further comprising:

a target value setting step of setting a second target value used for determining the first target value; and a predicting step of predicting a second distribution from the first distribution when each wiring path attains the second target value, wherein said yield calculating step includes calculating a second yield of said integrated circuit from the second distribution, and said target value determining step includes determining the second target value as the first target value when the second yield is within the allowable range of the predetermined value.

15. A computer readable storage medium storing a layout program for an integrated circuit according to claim 14, wherein said judging step includes judging whether or not the first yield takes, if the second yield is not the allowable range of the predetermined value, a value smaller than the predetermined value;

said target value setting step includes setting, when the second yield takes the value smaller than the predetermined value, a value smaller than the second target value newly as the second target value, and setting, when the second yield does not take the value smaller than the predetermined value, a value larger than the second target value newly as the second target value, and said layout program further comprises a control step of controlling so as to repeatedly execute said yield calculating step, said judging step, said target value determining step, said target value setting step and said predicting step till the second yield falls within the allowable range of the predetermined value.

16. A computer readable storage medium storing a layout program for an integrated circuit according to claim 15, wherein said timing value calculating step calculates a timing value about each wiring path by the delay analysis of the signal propagation based on the connection information and the delay information of the wirings after changing the connections of the wirings; and said layout method further comprises a step of determining a specified wiring path based on the timing value, the timing value calculated a timing value about each wiring path by the delay analysis of the signal propagation based on the connection information and the delay information of the wirings after changing the connections of the wirings by said timing value calculating step, wherein said distribution calculating step includes calculating the first distribution about the specified wiring path by the delay analysis of the signal propagation based on the post-updating connection information, the post-updating delay information and the fluctuation factor.

17. A computer readable storage medium storing a layout program for an integrated circuit according to claim 16, wherein said predicting step includes predicting the second distribution from the first distribution by use of a value obtained by subtracting the second target value from the timing value.

* * * * *

UNITED STATES PATENT AND TRADEMARK OFFICE
CERTIFICATE OF CORRECTION

| | | |
|---|---|---|
| PATENT NO. | : 7,424,694 B2 | |
| APPLICATION NO. | : 11/394122 | |
| DATED | : September 9, 2008 | |
| INVENTOR(S) | : Hiroshi Ikeda | |

It is certified that error appears in the above-identified patent and that said Letters Patent is hereby corrected as shown below:

First Page, Column 2 (Other Publications), Line 2, change "437-442," to --437-442.--.

Column 15, Line 61, change "value-from" to --value from--.

Signed and Sealed this

Ninth Day of December, 2008

JON W. DUDAS
*Director of the United States Patent and Trademark Office*